United States Patent [19]

Shannon

[11] Patent Number: 4,506,284

[45] Date of Patent: Mar. 19, 1985

[54] ELECTRON SOURCES AND EQUIPMENT HAVING ELECTRON SOURCES

[75] Inventor: John M. Shannon, Whyteleafe, England

[73] Assignee: U.S. Philips Corporation, New York, N.Y.

[21] Appl. No.: 439,143

[22] Filed: Nov. 4, 1982

[30] Foreign Application Priority Data

Nov. 6, 1981 [GB] United Kingdom ................. 8133502

[51] Int. Cl.[3] ............................................. H01L 29/34

[52] U.S. Cl. ........................................ 357/52; 357/13; 357/4; 357/88; 357/90

[58] Field of Search ....................... 357/13, 88, 90, 52, 357/4

[56] References Cited

U.S. PATENT DOCUMENTS

| | | | |
|---|---|---|---|
| 2,960,659 | 11/1960 | Burton | 357/13 |
| 3,422,322 | 1/1969 | Haisty | 357/88 |
| 3,931,633 | 1/1976 | Shannon | 357/13 |
| 4,000,503 | 12/1976 | Matare | 357/52 |
| 4,015,284 | 3/1977 | Hara et al. | 357/52 |
| 4,259,678 | 3/1981 | Van Gorkom et al. | 357/13 |
| 4,303,930 | 12/1981 | Van Gorkom et al. | 357/13 |
| 4,352,117 | 9/1982 | Cuomo et al. | 357/52 |

*Primary Examiner*—Martin H. Edlow

*Attorney, Agent, or Firm*—Robert T. Mayer; Steven R. Biren

[57] ABSTRACT

An electron source having good electron emission efficiency comprises a silicon or other semiconductor body (10) having an n-type first region (3) which is separated from an n-type or p-type second region (2) by a barrier. The barrier may be a p-n junction between p-type region (2) and the n-type region (3), or it may be a p-type region (1) forming p-n junctions with the n-type regions (2 and 3). By means of electrode connections (13 and 12) to the first and second regions (3 and 2) a potential difference (V) is applied across the barrier so as to bias the first region (3) positive with respect to the second region (2) and thereby to establish a supply of hot electrons (24) injected from the second region (2) across the barrier into the first region (3). These hot electrons (24) are emitted into free space (20) from a surface area (4) of the body (10) which may have a caesium coating (14) to reduce the electron work function. A surface region (5) which may be depleted even at zero bias adjoins the surface area (4) and comprises a p-type doping concentration which serves to form in the body (10) a potential peak which is spaced from the surface area (4) from which the hot electrons (24) are emitted to provide an adjacent drift field (15) which accelerates electrons (24) towards this surface area (4) so assisting the electron emission. The electron sources may be used in cathode-ray tubes, display devices and even electron lithography equipment.

9 Claims, 4 Drawing Figures

ELECTRON SOURCES AND EQUIPMENT HAVING ELECTRON SOURCES

This invention relates to an electron source for emitting a flow of electrons, particularly but not exclusively an electron source for cathode-ray tubes, image pick-up devices, display devices or electron lithography. The invention further relates to equipment having such an electron source.

U.K. Patent Specification (GB-A) No. 830,086 discloses an electron source comprising a semiconductor body having an n-type first region which is separated from a second region of the body by a barrier including a p-n junction located between the first and second regions, and electrode connections to said first and second regions for applying a potential difference across the barrier so as to bias the first region positive with respect to the second region and thereby to establish a supply of hot electrons which are injected from the second region across the barrier into the first region and which are emitted from a surface area of the body.

In the main forms disclosed in GB-A No. 830,086 the second region is of p-type conductivity and the barrier is provided by a single p-n junction formed between the p-type second region and n-type first region. This single p-n junction is reverse-biased into avalanche breakdown by applying a sufficiently large potential difference between the electrode connections to the first and second regions. In all cases described in GB-A No. 830,086 the body surface area from which the hot electrons are emitted is a surface of the n-type first region. This n-type surface region is coated with a material reducing the electron work function. In spite of this coating the n-type surface region has a significantly high effective electron affinity adjacent the boundary of the body defined by the surface area. In practice it is found that, in spite of acquiring a high kinetic energy in the avalanche breakdown, only a very low percentage (usually much less than 1%) of the hot electrons can be emitted into free space. Most of the hot electrons injected into the n-type first region experience quantum mechanical reflection at the boundary of the body which coincides with the surface area at which the surface barrier occurs.

The present invention is based on a recognition by the present inventor that the probability of hot electrons being reflected back into the n-type first region from the surface area of the semiconductor body can be decreased by forming within the body adjacent this surface area a strong electric field to accelerate the hot electrons towards said surface area, and that by providing a p-type doping concentration in a very thin surface region this field can be incorporated in an electron source to aid emission of the hot electrons from the surface area, without interfering with the mechanism for injecting hot electrons into the n-type first region and without significantly increasing the scattering of the hot electrons in their passage to the surface area.

According to a first aspect of the present invention there is provided an electron source for emitting a flow of electrons, comprising a semiconductor body having an n-type first region which is separated from a second region of the body by a barrier including a p-n junction located between the first and second regions, and electrode connections to said first and second regions for applying a potential difference across the barrier so as to bias the first region positive with respect to the second region and thereby to establish a supply of hot electrons which are injected from the second region across the barrier into the first region and which are emitted from a surface area of the body, characterized in that the body further comprises a surface region which adjoins the surface area from which the hot electrons are emitted and which comprises a p-type doping concentration serving to form between the n-type first region and said surface area a potential peak which is spaced from said surface area to provide adjacent said surface area a drift field which accelerates electrons towards said surface area.

In such an electron source in accordance with the invention the hot electrons injected into the n-type first region can surmount the potential peak of the p-type surface region without significant quantum mechanical reflection since this peak is within the body by being spaced away from the boundary of the body corresponding to the surface area. Having crossed this peak the hot electrons experience the accelerating effect of the drift field in a direction towards the surface area. Thus, although on traversing the n-type first region the hot electrons may obtain a broad momentum spread as a result of scattering in the first region, this accelerating drift field increases the average component of their momentum and energy perpendicular to the surface area. This reduces the probability of quantum mechanical reflection at the boundary of the body corresponding to the surface area and so assists their emission across this boundary. The invention thus permits improvement in the efficiency of emission of the hot electrons from the surface area without interfering with the first and second region mechanism for injecting the hot electrons into the n-type first region. By optimising the thicknesses and doping concentrations of the various regions and by activating the surface with a material such as caesium to reduce the electron work function, electron sources having such surface region drift fields in accordance with the invention can have emission efficiencies so high that more than 1% of the hot electrons injected into the n-type first region can be emitted from the surface area.

Electron sources are known comprising a p-n junction which is formed in an n-type semiconductor body by a surface-adjoining region having p-type conductivity and which is operated under forward bias by applying a potential difference between electrode connections to the p-type region and the n-type body portion. Such known electron sources are described in for example U.K. Patent Specification GB-A No. 1,147,883 (Our reference: PHN 826). Electrons are injected from the n-type body portion across the forward-biased p-n junction into the p-type region which has a thickness less than the diffusion recombination length of the electrons in the p-type material and which is coated with a material reducing the electron work function. These electrons diffuse through the p-type region and some of them emerge from the coated surface area of this region.

Such forward-biased p-n junction electron sources are known by the expression "negative electron affinity cathodes", since by appropriately choosing the combination of the coating material and semiconductor material the electron affinity of the p-type region can be effectively suppressed. However in practice in order to obtain a large decrease in the electron affinity the semiconductor material should have a wider band gap than that of silicon. Thus, gallium arsenide, gallium phosphide and other wider band gap materials are used for these electron sources. The injected electrons have only low kinetic energy and the emission current is restricted by carrier recombination occurring in the p-type region. Minimisation of the thickness of the p-type region to reduce recombination effects is complicated by the need to provide a good current path in the p-type region and a separate electrode connection for biasing purposes. A very high doping for the p-type region is undesirable in order to minimize recombination effects in the p-type region and to maintain a high injection efficiency at the forward-biased p-n junction. However the injected electrons constitute minority carriers in the p-type region so that the switching rate of these electron sources is slow due to minority carrier storage effects. Moreover the coating of material reducing the electron work function is slowly lost during operation of the electron source so limiting the life of the source.

By constrast with these known negative electron affinity sources, the present invention provides an electron source in which hot electrons directed towards the surface are generated with high kinetic energy by reverse-biasing the barrier between the first and second regions and for which a good electron emission efficiency can be obtained even in the presence of a surface barrier and with silicon material. The hot electrons have a characteristic length for energy loss substantially greater than their ballistic mean free path in the semiconductor material and so can traverse efficiently the n-type first region and surface region having a thickness of the order of the ballistic mean free path. The p-type doping concentration in the surface region provides an advantageous field distribution assisting emission from the surface area as described hereinbefore, and this surface region of an electron source in accordance with the present invention does not require a separate electrode connection and can be so thin as to be depleted throughout its thickness at least during operation of the electron source. Thus electron sources in accordance with the present invention can have negligible minority storage effects and hence a fast switching speed.

In electron sources in accordance with the present invention, the thickness of the surface region is preferably of the order of the ballistic mean free path so as to maximise the effect of the surface field in accelerating the hot electrons in the direction of the surface area. Thus, for example, the thickness of the surface region may be at most 10 nanometers. Such a thin surface region may be depleted of holes throughout its thickness by the depletion layer formed with said n-type first region even at zero bias. In this manner a very high drift field can be obtained, and the electron source may also have a very high switching speed.

When the n-type first region is provided with a peak doping concentration spaced from said surface area, for example by n-type dopant ion implantation, the p-type doping concentration can be incorporated between the surface area and the peak doping concentration of the n-type first region without significantly complicating the manufacturing process or the configuration of the first and second regions which generate the hot electrons. Furthermore the surface region does not require a separate electrode connection, so that incorporation of this p-type surface region in accordance with the present invention need not complicate the electrode connection configuration. This is particularly advantageous when forming an array of electron sources in the same semiconductor body. Thus, the region structure formed by the surface region and the first and second regions need have only two electrode connections, one of which is to said first region while the other is to said second region. Furthermore the electrode connection to the n-type first region may also contact part of said surface region. Such contacting of said surface region can result when the electrode connection to the n-type first region is used as a mask during the introduction of the p-type doping concentration. This is advantageous in simplifying the manufacture of the structure.

The hot electrons can be generated in the body by avalanche breakdown or by field-emission. Thus, said second region may be of p-type conductivity and the barrier between the first and second regions may be provided by the p-n junction which the p-type second region forms with the n-type first region.

However, in accordance with the present invention, the p-type doping concentration providing the drift field may be incorporated in an electron source which generates hot electrons at an operating voltage below the critical level necessary for avalanche breakdown, for example as disclosed and claimed in the co-pending patent application Ser. No. 439,144 (Our reference: PHB 32828) which is filed on the same day as the present application and which is also entitled "Electron sources and Equipment having electron sources". Thus, said second region may be of n-type conductivity and be separated from the n-type first region by a barrier region having a p-type doping concentration which forms p-n junctions with both the n-type first and second regions.

According to a second aspect of the present invention there is provided equipment comprising a vacuum envelope within which a vacuum can be maintained, and an electron source in accordance with the first aspect of the invention, said electron source being mounted within the envelope for emitting electrons into said vacuum during operation of the equipment. Such equipment may be, for example, a cathode-ray tube, an image pick-up device, a display device, or electron lithography equipment for the manufacture of microminiature solid-state devices. Thus, depending on the type of equipment, the semiconductor body may comprise a single electron source or an array of such electron sources.

These and other features in accordance with the present invention will now be described with reference to the accompanying diagrammatic drawings illustrating, by way of example, various embodiments of the invention. In these drawings.

Figure 1:
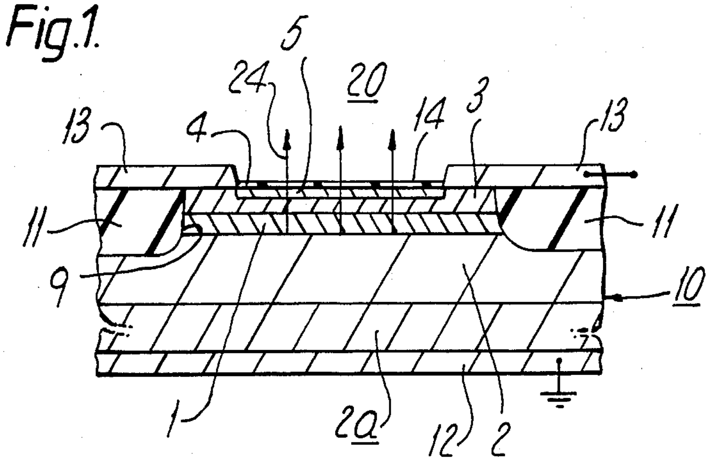
FIG. 1 is a cross-sectional view of part of a semiconductor body of an electron source in accordance with the invention.

It should be noted that all the Figures are diagrammatic and not drawn to scale. The relative dimensions and proportions of some parts of these Figures have been shown greatly exaggerated or reduced for the sake of convenience and clarity in the drawing. The same reference numerals as used in one embodiment are generally used to refer to corresponding or similar parts in the other embodiments.

The electron source illustrated in FIG. 1 comprises a monocrystalline silicon semiconductor body 10 having an n-type first region 3 which is separated from a second region 2 of the body 10 by a barrier 1 including two p-n junctions located between the first and second regions 3 and 2. Thus, in the electron source of FIG. 1, the second region 2 is of n-type conductivity and the barrier is provided by a region 1 having a p-type doping concentration which forms the two p-n junctions with the n-type regions 2 and 3 respectively. The electron source has electrode connections 12 and 13 to the regions 2 and 3 respectively. These connections 12 and 13 which may comprise metal layers forming ohmic contacts to the regions 2 and 3 serve for applying a potential difference V across the barrier 1 so as to bias the region 3 positive with respect to the region 2 and thereby establish a supply of hot electrons 24 which are injected from the region 2 across the barrier 1 into the region 3 and which are emitted from a surface area 4 of the body 10.

In the electron source of FIG. 1, the region providing the barrier 1 forms depletion layers with both the n-type regions 2 and 3 and has such a thickness and doping concentration as to be depleted of holes by the merging together of the depletion layers in the region 1 at least when the potential difference V is applied to establish the supply of hot electrons 24 with sufficient energy to overcome the potential barrier present between the surface area 4 and free space 20. However the region 1 may even be depleted of holes by the merging of the depletion layers under zero bias conditions. Electron sources having such depleted barrier regions 1 are disclosed and claimed in the said co-pending patent application Ser. No. 439,144 (Our reference: PHB 32828) to which reference is invited for further information.

Figure 2:
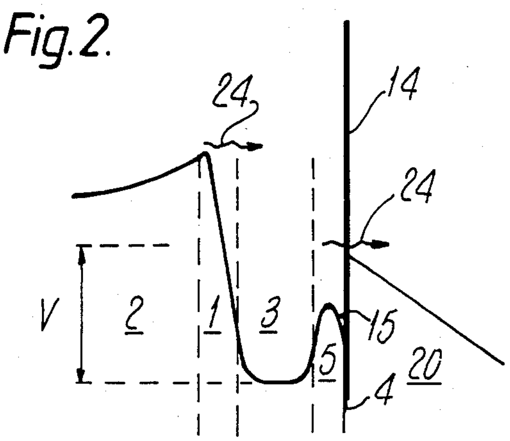
FIG. 2 is an energy diagram through such an electron source under bias conditions.

In accordance with the present invention the body 10 of the electron source of FIG. 1 further comprises a surface region 5 which adjoins the surface area 4 from which the hot electrons 24 are emitted and which comprises a p-type doping concentration serving to form between the n-type first region 3 and the surface area 4 a potential peak which, as illustrated in FIG. 2, is spaced from the surface area 4 to provide adjacent the surface area 4 a drift field 15 for accelerating electrons 24 towards said surface area 4. In this manner an advantageous field configuration is obtained adjacent the surface area 4 to assist emission of the hot electrons 24 into free space 20.

In the device structure of FIG. 1 the surface region 5 is present at an aperture in the electrode layer 13 which is of annular configuration. This electrode layer 13 (which forms the connection to the region 3) may also contact the surface region 5 for example around the whole periphery of the junction between the regions 3 and 5. The surface area 4 of the region 5 is coated with a very thin film 14 of a material reducing the work function, for example caesium. In the case of a clean uncoated silicon surface 4 the surface barrier is between 4 and 5 eV, but it is reduced to about 2 eV by providing the coating 14 in known manner.

FIG. 1 illustrates a particular compact, low capacitance structure for the electron source. An apertured insulating layer 11 is sunk over at least part of its thickness in the body 10 to form at least one mesa portion 9 of the body 10 bounded laterally by the sunken insulating layer 11. The regions 1 and 3 are formed within the mesa portion 9 and are bounded around their edges by the insulating layer 11. The electrode connection 13 can be provided in a reliable manner at the top surface of the mesa portion 9 without contacting the barrier region 1, although it may contact the surface region 5. This electrode connection 13 can extend onto and across the insulating layer 11 to provide an extended contact area to which external connections (for example in the form of wires) can be bonded. The top surface of the mesa portion 9 provides the surface area 4 from which the electrons 24 are emitted.

In the electron source of FIG. 1 the region 2 can be formed by a high resistivity n-type epitaxial layer (n-) on a low resistivity n-type substrate *2a*. The substrate *2a* provides a low resistance connection to the metal layer 12 which can extend over the whole back surface of the substrate *2a*. Such a substrate arrangement is particularly suitable for a device having only a single electron source in the body 10. However it may also be used for devices having a plurality of these electron sources in a common body 10 with a common region 2 and common electrode connection 12 but with separate individual electrode connections 13 for the individual electron sources having individual regions 1 and 3.

The manufacture of a particular example of the electron source structure of FIG. 1 will now be described. A phosphorus-doped silicon layer having a resistivity of, for example, 5 ohm-cm (approximately $10^{15}$ phosphorus atoms/$cm^3$) and a thickness of, for example, 5 micrometers is epitaxially grown in known manner on a phosphorus-doped silicon substrate *2a* having a resistivity of, for example, 0.05 ohm-cm. and a thickness of, for example, 240 micrometers. The insulating layer 11 can be formed locally in the major surface of the epitaxial layer using known thermal oxidation techniques to a sufficient depth, for example 0.1 micrometer or more, below the silicon surface. The particular depth chosen is determined by the height of the mesa portion 9 needed to accommodate reliably regions 1, 3 and 5 of particular thicknesses. The regions 1, 3 and 5 can then be formed in the mesa portion 9 by ion implantation. Boron ions in a dose of, for example, $2\times10^{14}\,cm^{-2}$ and at an energy of, for example, 4.5 keV may be used to form the region 1. Arsenic ions in a dose of, for example, $5\times10^{14}\,cm^{-2}$ and at an energy of 10 keV may form the n-type region 3. A localized implantation of boron ions in a dose of, for example $7.5\times10^{13}\,cm^{-2}$ and at an energy of, for example, 0.8 keV may be used to form the p-type doping concentration of the surface region 5. This second boron implantation may be localised by first providing the electrode layer 13 to act as an implantation mask. For this purpose the electrode layer 13 may be of, for example, n-type polycrystalline silicon. After annealing the implants, for example, at 700° C. in vacuo, the metal layer 12 which may be of aluminium is provided to form the electrode connection to the substrate *2a*, and the surface area 4 is provided in known manner with the coating 14.

The precise characteristics obtained for the electron source depend on the active doping concentration and thickness finally obtained for each of the regions 1, 3 and 5, and these depend on the particular ion species, energy and dose used and on the annealing conditions. In an electron source manufactured as described above the region 3 is estimated to have a depth of 25 nanometers and an active doping concentration of $5\times10^{20}$ $cm^{-3}$, the peak of which is estimated to occur about 12 nanometers from the surface 4. By having such a small depth for the region 3, energy loss for the electrons 24 in the region 3 is kept low so enhancing the likelihood for emission of the electrons from the surface area 4. Those electrons which are not emitted from the surface area 4 are extracted via the electrode connection 13. By having such a high doping concentration in spite of its small thickness the n-type region 3 exhibits an electrical resistance which is sufficiently low for rapid modulation of the emitted electron flux. The barrier region 1 is estimated to have a thickness of about 50 nanometers and an active doping concentration of about $2\times10^{18}$ $cm^{-3}$ resulting in a potential barrier of about 4 volts to electron flow from region 2 to region 3. The resulting barrier region 1 is undepleted of holes over a part of its thickness by the depletion layers formed with the n-type regions 2 and 3 at zero bias. The application of a potential difference V of at least a predetermined minimum magnitude is necessary to spread these depletion layers across the whole thickness of the region 1. The surface region 5 is estimated to have a thickness of about 7.5 nanometers and an active doping concentration of $5\times10^{19}$ $cm^{-3}$, resulting in a potential peak of 0.7 eV spaced about 5 nanometers from the silicon surface 4 and a mean electric field 15 of $2\times10^{6}$ volts $cm^{-1}$. The resulting surface region 5 is substantially depleted of holes even at zero bias. Such an electron source can operate with a voltage V of about 4 volts.

FIG. 2 is a schematic electron energy and potential diagram through the electron source into free space with the bias voltage V applied between the electrode connections 12 and 13 and with the electron source biased as a cathode in a vacuum envelope. The barrier region 1 as illustrated is depleted of holes by the depletion layers formed with the n-type regions 2 and 3. The thin coating 14 on the surface area 4 is illustrated as a surface dipole layer reducing the electron work function. The p-type doping concentration of the surface region 3 results in the advantageous electric field configuration adjacent the surface area 4 as illustrated in FIG. 2. The surface region 5 introduces a potential peak which is spaced from the surface area 4 and which can be crossed by the hot electrons without much reflection since this peak is within the body instead of coinciding with a boundary surface of the body. Having crossed the peak the hot electrons 24 experience the drift field 15 in a direction towards the surface area 4 so assisting their emission across this boundary surface of the body and into the vacuum 20.

Such a surface region 5 in accordance with the present invention may be incorporated in many different hot electron source structures and in different types of hot electron source which use a different injection mechanism. Thus such a surface region 5 can be incorporated in a non-mesa form of the type of electron source illustrated in FIGS. 1 and 2, in which the insulating layer 11 is not sunk in the body 10 over the depth of the regions 1, 3 and 5, but instead the p-n junctions between the regions 2 and 1 and between the regions 1 and 3 are brought to the top surface of the body 10 by means of a p-type deep annular boundary region which is not fully depleted even during operation of the source. In this case the n-type region 3 can be contacted via a deep n-type annular boundary region present in the p-type boundary region. Such a modification uses the same injection mechanism from an n-type region 2 across a p-type barrier region 1 and into the regions 3 and 5.

Figure 3:
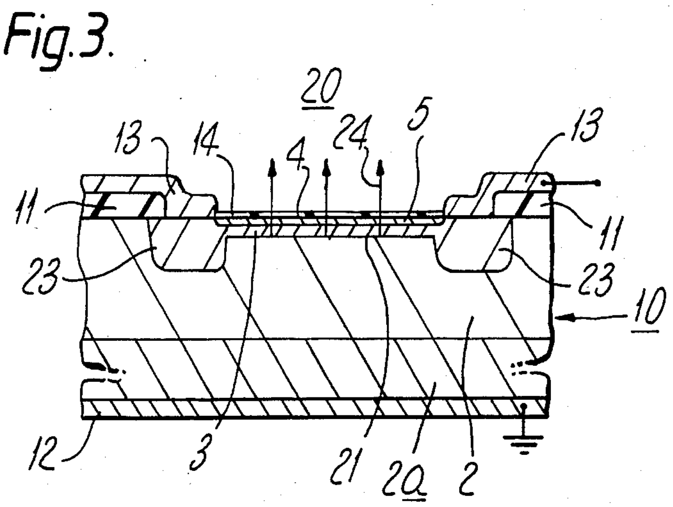
FIG. 3 is a cross-sectional view of part of a semiconductor body of another electron source in accordance with the invention.

FIG. 3 illustrates a different type of hot electron source as a further embodiment of the present invention. In this case the p-type doping concentration forming the depleted surface region 5 is incorporated in an n-type first region 3 which is separated from a p-type second region 2 by a barrier formed by a single p-n junction 21. The substrate 2*a* is highly-doped p-type silicon having thereon a p-type silicon epitaxial layer 2 in which the n-type region 3 and surface region 5 are formed, for example by ion implantation. Before providing the regions 3 and 5 a deep n-type region 23 is provided in the epitaxial layer, for example by dopant diffusion. The n-type region 23 is an annular boundary region which brings the p-n junction 21 (between regions 2 and 3) to the top surface of the body 10 and provides a contact region for the electrode connection 13. The central portion of the p-n junction 21 formed by the n-type region 3 has a lower breakdown voltage than the peripheral portions of said p-n junction formed by the n-type region 23.

The doping concentrations of the regions 3 and 2 can be chosen in known manner so that breakdown of the reverse-biased junction 21 occurs by avalanche ionization. By applying a voltage V of suitable magnitude between the connections 12 and 13 to bias the region 3 positive with respect to the region 2, breakdown of the central portion of the junction 21 results in a supply of hot electrons 24 injected into the region 3. The field configuration resulting from the p-type doping concentration of the surface region 5 assists emission of these hot electrons 24 from the surface area 4 in accordance with the present invention. Thus, as described in the previous embodiments, the region 5 introduced into the electron source of FIG. 3 a potential peak spaced from the surface area 4 to provide a drift field for accelerating the electrons 24 towards the surface area 4. Such a feature may also be incorporated in the different avalanche-breakdown structures disclosed in the published U.K. patent application (GB) No. 2054959A (our reference: PHN 9532).

Figure 4:
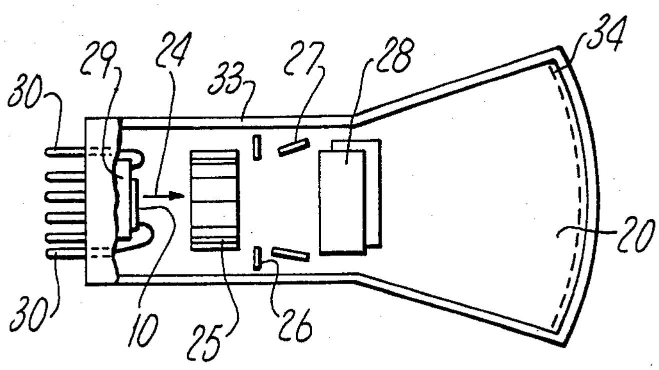
FIG. 4 is a cathode-ray tube in accordance with the invention and including an electron source in accordance with the invention.

The electron sources of FIGS. 1, 2 or 3 in accordance with the invention can be incorporated as cold cathodes in many different forms of equipment having a vacuum envelope. FIG. 4 illustrates one such equipment, by way of example, namely a cathode-ray tube. This equipment of FIG. 4 comprises a vacuum tube 33 which is flared and which has an end wall coated with a fluorescent screen 34 on its inside. The tube 33 is hermetically sealed to accommodate a vacuum 20. Included in the tube 33 are focussing electrodes 25,26 and deflection electrodes 27,28. The electron beam 24 is generated in one or more electron sources in accordance with the present invention which are situated in the semiconductor body 10. The body 10 is mounted on a holder 29 within the tube 33, and electrical connections are formed between the metal layers 12,13 and terminal pins 30 which pass through the base of the tube 33. Such electron sources in accordance with the present invention may also be incorporated in, for example, image pick-up devices of the vidicon type. Another possible equipment is a memory tube in which an information-representative charge pattern is recorded on a target by means of a modulated electron flow generated by the electron source of the body 10, which charge pattern is subsequently read by a constant electron beam generated preferably by the same electron source.

Known technology used for the manufacture of silicon integrated circuits can be used to fabricate electron sources in accordance with the invention as an array in a common semiconductor body. This is facilitated by the simple structure of such sources needing only electrode connections to the two regions 3 and 2. Thus the device body may comprise a two-dimensional array of such electron sources each of which can be individually controlled to regulate its own individual electron emission. The bulk of the body 10 may be lightly-doped material which is of opposite conductivity type to the regions 2 and in which the regions 2 are provided as islands. The individual electron sources may be connected together in an X-Y cross-bar system. The n-type regions 3 in each X-direction of the array may have a common electrode connection 13(1), 13(2), etc. which extends in the X-direction. The islands providing the regions 2 may be in the form of stripes 2(1), 2(2), 2(3) etc. which extend in the Y-direction of the array to connect together in a common island the regions 2 of the individual electron sources in each Y-direction. Each of these strips 2(1), 2(2), 2(3) etc. may have an electrode connection 12(1), 12(2), 12(3) etc. Individual electron sources of the X-Y array can be controlled by selecting the electrode connections 12(1), 12(2) etc. and 13(1), 13(2) etc. to which the operating voltages V(Y) and V(X) are applied to bias the region 3 positive with respect to the region 2 for electron emission via the region 5. Different magnitudes of bias can be applied to these different connections so that different electron fluxes 24 can be emitted by different electron sources so generating a desired electron flux pattern from the whole array.

Such a two-dimensional array device is particularly useful as an electron source in a display device which can have a flatter vacuum tube 33 than that of the cathode-ray tube of FIG. 4. In such a flat device, the picture can be produced on a fluorescent screen 34 at one side of the tube by generating different electron flux patterns from the array in the body 10 mounted at the opposite side of the tube, instead of by deflecting a single electron beam as in a cathode-ray tube. Such a two-dimensional array is also useful for electron lithography in the manufacture of semiconductor devices, integrated circuits and other microminiature solid-state devices. In this application the array is mounted as the electron source in a chamber of a lithographic exposure apparatus. The chamber is connected to a vacuum pump for generating a vacuum in the chamber for the exposure operation. The use of a semiconductor two-dimensional electron-source array for display devices and for electron lithography is already described in U.K. patent application No. 7902455 (Our reference: PHB 9025) published as GB No. 2013398A to which reference is invited.

A surface region 5 in accordance with the present invention can be incorporated in the n-type regions of p-n electron sources of the 3-electrode type disclosed in GB No. 2013398A, both single sources and arrays. Thus, an electron source in accordance with the present invention may include an accelerating electrode which is insulated from the semiconductor surface and which extends around the edge of the depleted surface region 5 at the area 4 from which the hot electrons 24 are emitted. In this case the n-type first region 3 can be contacted by its electrode connection via a deep n-type contact region at an area remote from the surface area 4 from which the hot electrons 24 are emitted.

Many other modifications are possible within the scope of the present invention. Thus, for example, instead of having a monocrystalline silicon body 10 the semiconductor body of an electron source in accordance with the invention may be of other semiconductor material, for example a III-V semiconductor compound, or polycrystalline or hydrogenated amorphous silicon which is deposited on a substrate of glass or other suitable material.

I claim:

1. An electron source for emitting a flow of electrons, comprising a semiconductor body having an n-type first region which is separated from a second region of the body by a barrier including a p-n junction located between the first and second regions, and electrode connections to said first and second regions for applying a potential difference across the barrier so as to bias the first region positive with respect to the second region and thereby to establish a supply of hot electrons which are injected from the second region across the barrier into the first region and which are emitted from a surface area of the body, characterized in that the body further comprises a surface region which adjoins the surface area from which the hot electrons are emitted and which comprises a p-type doping concentration serving to form between the n-type first region and said surface area a potential peak which is spaced from said surface area to provide adjacent said surface area a drift field which accelerates electrons towards said surface area.

2. An electron source as claimed in claim 1, further characterized in that the p-type doping concentration of the surface region is depleted of holes throughout its thickness by the depletion layer formed with said first region even at zero bias.

3. An electron source as claimed in claim 1, further characterized in that said surface region has a thickness of at most 10 nanometers.

4. An electron source as claimed in claim 1, further characterized in that the region structure formed by the surface region and the first and second regions has only two electrode connections, one of which is to said first region while the other is to said second region.

5. An electron source as claimed in claim 1, further characterized in that said electrode connection to the n-type first region also contacts part of said surface region.

6. An electron source as claimed in claim 1, wherein the second region is of n-type conductivity and is separated from the n-type first region by a barrier region having a p-type doping concentration which forms p-n junctions with both the n-type first and second regions.

7. An electron source as claimed in claim 1, wherein the second region is of p-type conductivity, and the barrier is provided by the p-n junction which the p-type second region forms with the n-type first region.

8. An electron source as claimed in claim 1, wherein said surface area of the surface region is covered with a material reducing the electron work function.

9. Equipment comprising a vacuum envelope within which a vacuum can be maintained, and an electron source as claimed in claim 1, said electron source being mounted within the envelope for emitting electrons into said vacuum during operation of the equipment.

* * * * *